US006617677B2

(12) United States Patent
Steffens

(10) Patent No.: US 6,617,677 B2
(45) Date of Patent: Sep. 9, 2003

(54) ELECTRIC OR ELECTRONIC COMPONENT AND METHOD OF MANUFACTURING SUCH A COMPONENT

(75) Inventor: Engelbert Steffens, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/960,903

(22) Filed: Sep. 24, 2001

(65) Prior Publication Data

US 2002/0142521 A1 Oct. 3, 2002

(30) Foreign Application Priority Data

Sep. 23, 2000 (DE) .......................................... 100 47 213

(51) Int. Cl.⁷ ............................................... H01L 23/06
(52) U.S. Cl. ....................... 257/684; 257/693; 257/701; 438/125; 438/126; 438/121; 438/928
(58) Field of Search ................................ 438/106, 113, 438/125, 126, 127, 928, 121; 257/684, 693, 701, 729

(56) References Cited

U.S. PATENT DOCUMENTS

| | | | |
|---|---|---|---|
| 5,963,429 A | * 10/1999 | Chen .......................... | 361/764 |
| 6,133,064 A | * 10/2000 | Nagarajan et al. .......... | 438/106 |
| 6,191,370 B1 | * 2/2001 | Oh .............................. | 174/260 |
| 6,441,498 B1 | * 8/2002 | Song .......................... | 257/778 |

FOREIGN PATENT DOCUMENTS

DE 19720300 A 12/1997

* cited by examiner

Primary Examiner—Trung Dang
(74) Attorney, Agent, or Firm—Aaron Waxler

(57) ABSTRACT

To provide an electric or electronic component (100) comprising a carrier substrate (10) of a semiconducting or insulating material, at least a recess (12), particularly a cavity or indentation provided in the carrier substrate (10), at least a component (14) which is inserted into the recess (12) and whose surface having at least an electrically conducting contact face (16) faces the bottom and/or wall area (18) of the recess (12) and is contacted in the bottom and/or wall area (18) of the recess (12), and at least a filling material (20) by means of which the component (14) inserted into the recess (12) is sealed particularly with the edges of the recess (12), as well as a method of manufacturing such a component, in which method, in comparison with the state of the art, larger tolerances in the position and particularly the tilt of the component (14) inserted into the recess (12) are allowed, it is proposed that at least an electrically conducting contact track (22) extending from the bottom and/or wall area (18) of the recess (12) to the surface (28) of the carrier substrate (10) is provided, and in that at least an electrically conducting connection element (24) is arranged between the respective contact face (16) of the component (14) and the respective section of the contact track (22) present in the bottom and/or wall area (18) of the recess (12), by which connection element the contact face (16) of the component (14) is connected to the section of the contact track (22) present in the bottom and/or wall area (18) of the recess (12).

29 Claims, 2 Drawing Sheets

ELECTRIC OR ELECTRONIC COMPONENT AND METHOD OF MANUFACTURING SUCH A COMPONENT

Figure 1:
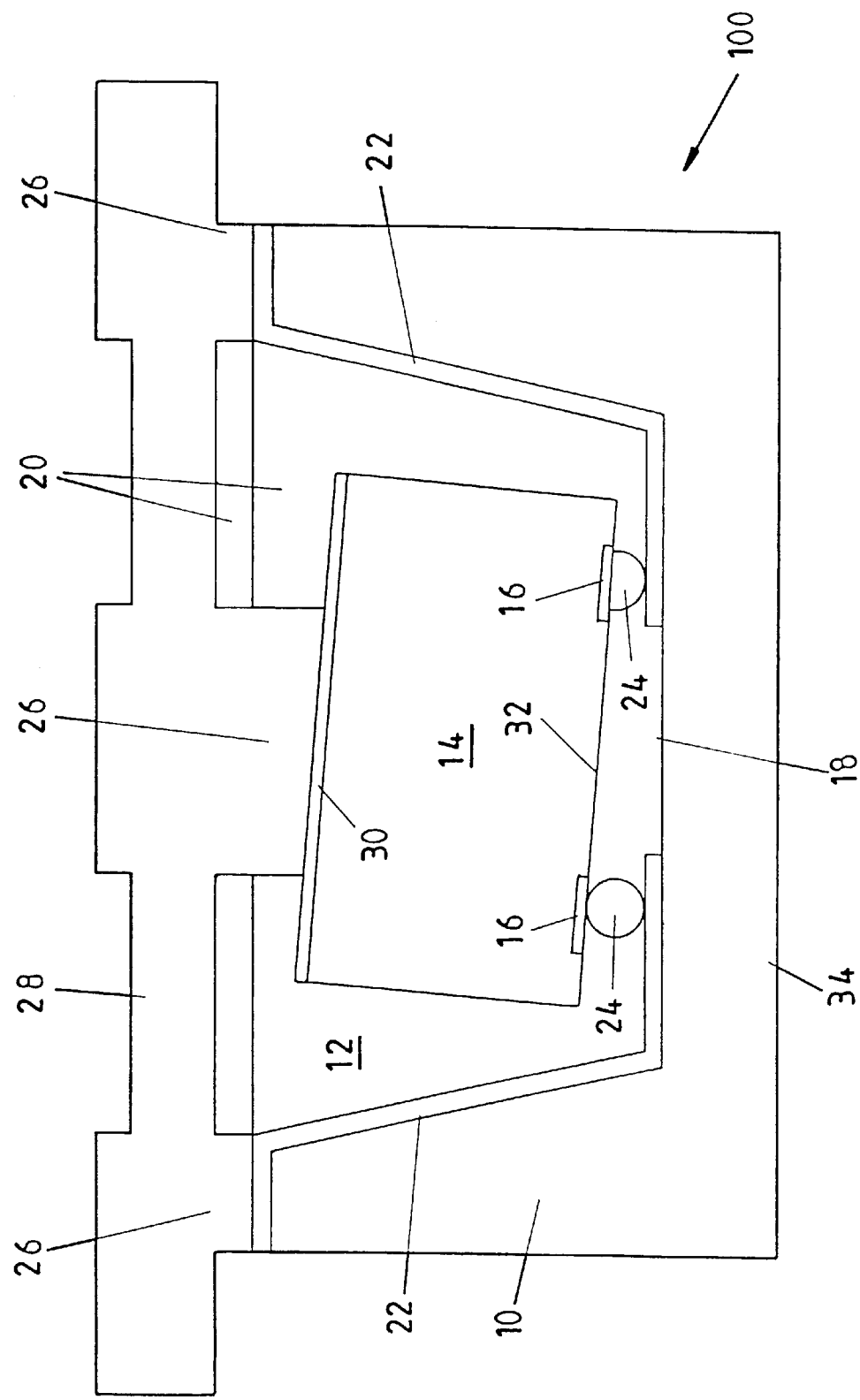

The invention relates to an electric or electronic component comprising a carrier substrate of a semiconducting or insulating material, at least a recess, particularly a cavity or indentation provided in the carrier substrate, at least a component which is inserted into the recess and whose surface having at least an electrically conducting contact face faces the bottom and/or wall area of the recess and is contacted in the bottom and/or wall area of the recess, and at least a filling material by means of which the component inserted into the recess is sealed particularly with the edges of the recess.

The invention also relates to a method of manufacturing an electric or electronic component, the method comprising the steps of:

generating, particularly etching, at least a recess particularly at least a cavity or indentation, in a carrier substrate of a semiconducting or insulating material, inserting at least a component, particularly at least an IC chip and/or at least an electrically active or electronically active (semiconductor) crystal, into the recess, in which the surface of the component having at least an electrically conducting contact face faces the bottom and/or wall area of the recess and is contacted in the bottom and/or wall area of the recess, and sealing the component inserted into the recess, particularly with the edges of the recess, by means of at least a filling material.

Such a component and such a method are known from DE 197 20 300 A1. This document describes an electronic hybrid component with a co-planar chip on chip arrangement and with an electric rear side contact. A (silicon) carrier substrate of the component accommodates at least a cavity in which an electric insulation layer provided with a metal coating is present and in which at least a chip arranged on the carrier substrate is inserted and electrically contacted with the metal coating.

The method of manufacturing this component, known from DE 197 20 300 A1, allows the use of the conventional techniques in microelectronics and microsystem techniques and is specifically based on the fact that regions countersunk by anisotropic etching are generated in the carrier substrate and that structuring for generating the electrically conducting connection between the countersunk regions and the conductor track structures present on the co-planar surface is realized by a multiple metallization system. In this multiple metallization system, the countersunk structures are insulated after etching by oxidation or deposition of insulating layers on the carrier substrate. Subsequently, the countersunk regions and the carrier substrate are metallized. Then, the multiple metal layer is structured by means of a photolithographic process, while maintaining given minimum structure widths.

It is true that this known method has a series of advantages such as the manufacture of compact electronic components with extremely small dimensions (small building height, small fundamental surface, i.e. small foot print) of the housing (package) as well as with similar or even equal thermal properties of the chip and package based on material similarity or even material identity. In the conventional method, costly manufacturing steps which are liable to disturbance such as wirebond, enveloping and/or plating processes as well as the use of material for lead frames and wires are neither required. However, the known component and the known method of manufacturing this component prove to be inadequate in that, already at minor tilts and/or oblique positions of the chips in the recess of the carrier substrate, an orderly function of the component is no longer guaranteed, for example, because the electric contacting of the chip with the inner (bottom and/or wall area) of the recess is no longer completely established.

For the known components this means that, when producing the recess in the carrier substrate by means of, for example, anisotropic etching, no tolerances are fundamentally allowed, which renders the manufacture of the components known from DE 197 20 300 A1 very costly and leads to a high number of rejects.

It is an object of the invention to provide an electric or electronic component of the type described in the opening paragraph, as well as a method of manufacturing such a component, in which, in comparison with the state of the art, larger tolerances in the position and particularly the tilt of the component inserted into the recess are allowed without a detrimental effect on the electric contacting of the component with the inner side (bottom and/or wall area) of the recess. In this respect, the object of the present invention is also to provide greater tolerances in generating the recess in the carrier substrate.

This object is achieved by the characteristic features defined in claim 1 for an electric or electronic component as well as by the characteristic features defined in claim 14 for a method of manufacturing an electric or electronic component. Advantageous embodiments and essential further embodiments of the present invention are defined in the dependent claims.

In accordance with the teaching of the present invention, at least one electrically conducting contact track extending from the bottom and/or wall area of the recess to the surface of the carrier substrate is provided, which contact track is provided, particularly lithographically, before insertion of the component. To ensure a reliable connection between the relevant contact face of the component and the respective section of the contact track which is present in the bottom and/or wall area of the recess, at least an electrically conducting connection element is arranged in this interspace, by which connection element the contact face of the component is connected to the contact track section which is present in the bottom and/or wall area of the recess.

The provision of such connection elements has the advantage that it allows a given tilt of the component inserted into the recess without the electric contacting of the component with the inner side (bottom and/or wall area) of the recess suffering therefrom. In this case it is possible (but not necessary) that at least a part of the connection element is deformed so that a degree of freedom as regards the depth position and the tilt of the component is surprisingly realized. Those skilled in the art will appreciate that the tolerances in the manufacture of the recess into which the component is inserted can be chosen to be essentially wider than for conventional manufacturing methods. The above-mentioned advantages also involve a significant cost benefit in the manufacture of the carrier substrate and in the assembly, i.e. in the complete embedding of the component in the recess.

The present invention finally relates to a method of manufacturing a multitude of electric or electronic components, defined by the characteristic features in claim 29.

This method is based on a wafer of a carrier substrate of a semiconducting or insulating material in which, particularly by (anisotropic) etching, a multitude of recesses, particularly cavities or indentations, is generated at preferably equal mutual distances. After performing the above-mentioned steps of the method, in this case simultaneously or successively for the multitude of recesses with at least one component, a test of each component as well as printing the surface of the carrier substrate opposite the surface of the carrier substrate particularly by means of a laser may follow, if necessary, and finally the multitude of coherently manufactured components is split into individual pieces, particularly by mechanical and/or optical sawing of the wafer.

An embodiment of the present invention will hereinafter be elucidated with reference to the drawing.

Figure 2:
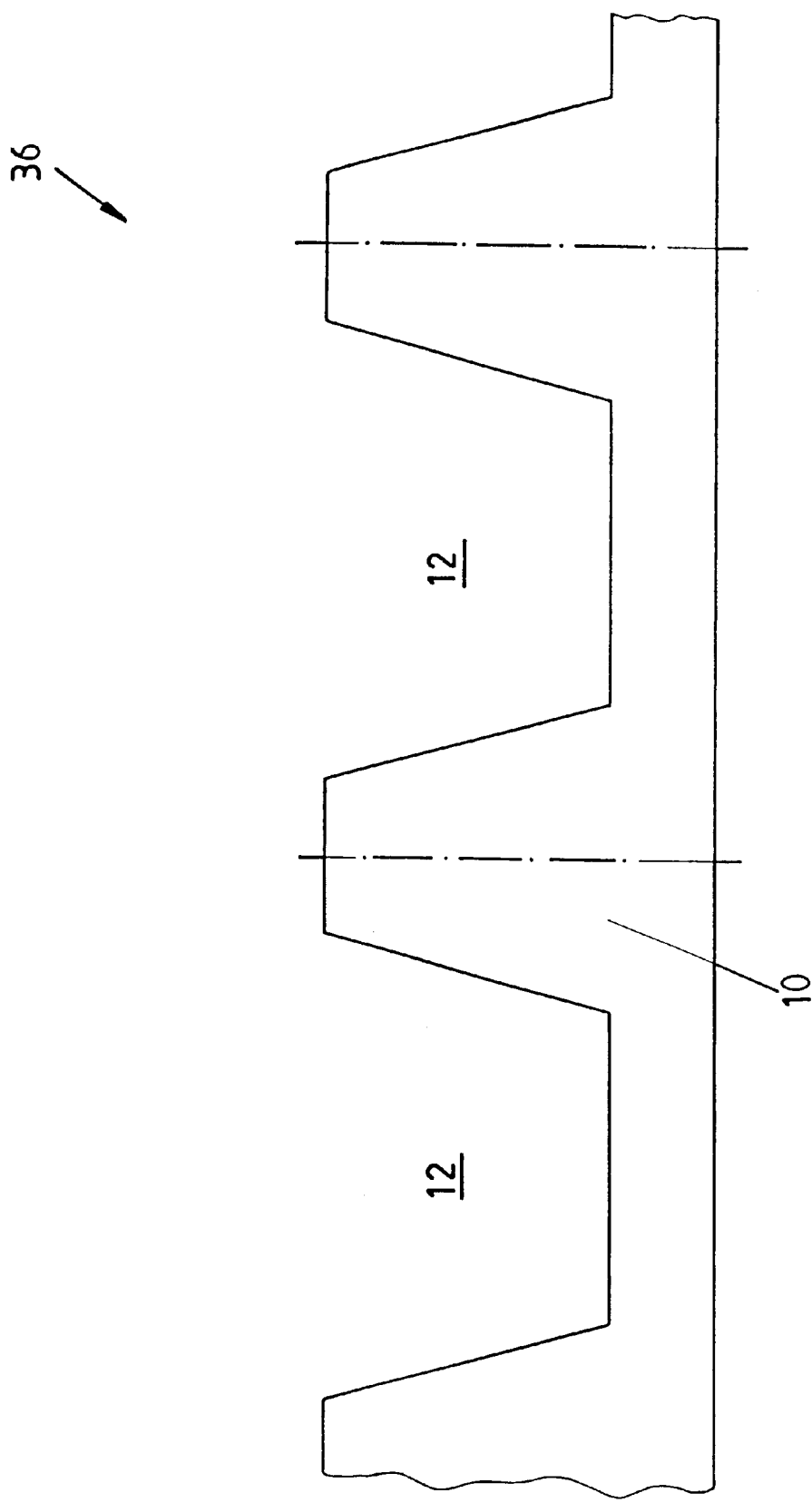

FIG. 1 shows an embodiment of an electric or electronic component according to the present invention, in a cross-section, and FIG. 2 shows an embodiment of a wafer of a carrier substrate of a semiconducting or insulating material, provided with a multitude of recesses, also in a cross-section.

The electric or electronic component 100 shown in FIG. 1 is used on a printed circuit board which is not shown for the sake of clarity in FIGS. 1 and 2 and is manufactured by first anisotropically etching an essentially trough-shaped recess 12 in the form of a cavity in a carrier substrate 10 of a semiconducting material (silicon). Subsequently, an electrically conducting contact track 22 is lithographically provided on sides of the recess 12, which face each other in FIG. 1, and is subjected to a finishing treatment so as to achieve a higher electric conductivity. These contact tracks 22 extend from the bottom area 18 of the recess 12 to the surface 28 of the carrier substrate 10.

Subsequently, a component 14 in the form of an electrically active or electronically active semiconductor crystal is inserted into the recess 12. The component 14 is embedded upside down in the recess 12, i.e. with its rear side upwards, so that the surface of the component 14 having two electrically conducting contact faces 16 faces the bottom area 18 of the recess 12.

The two electrically conducting contact faces 16 are now contacted in the bottom area 18 of the recess 12 with the contact tracks 22 by contacting the two contact faces 16 of the component 14 by means of two electrically conducting, essentially ball-shaped connection elements 24 of lead with the associated section of the relevant contact track 22 (=bottom-sided end of the relevant contact track 22 in the case of FIG. 1) present in the bottom area 18 of the recess 12. As a result, a soldered joint of the contact face 16 of the component 14 with the section of the contact track 22 present in the bottom area 18 of the recess 12 is obtained. Within the framework of manufacturing the electric or electronic component 100 shown in FIG. 1, the connection elements 24 are provided, prior to insertion of the component 14, in a fluid or moldable state, specifically in the form of a drop of electrically conducting material deposited from a liquid phase, on the contact face 16 of the component 14 so as to adapt, by way of subsequent deformation of at least a part of the connection elements 24, the position of the component 14 in the recess 12 to the bottom area 18 of the recess 12 and particularly to the contact face 16 of the component 14 (it is alternatively possible to provide the connection elements 24 before insertion of the component 14 on the associated sections of the relevant contact track 22 present in the bottom area 18 of the recess 12, while, before insertion of the component 14, each connection element 24 may advantageously be provided partly on the section of the contact track 22 present in the bottom area 18 of the recess 12 and partly on the contact face 16 of the component 14).

As is shown in FIG. 1, the arrangement of the connection elements 24 allows a given tilt of the component 14 inserted into the recess 12 without affecting the electric contacting of the component 14, particularly of the contact faces 16, with the respective section of the associated contact track 22. As can also be seen in FIG. 1 and as already indicated hereinbefore, a deformation of the straight part of the two connection elements 24 shown in FIG. 1 is the result, so that a degree of freedom as regards the depth position and the tilt of the component 14 is "gained".

To protect the component 14 from external influences, particularly from damage or corrosion when it is used at a later stage, the component 14 inserted into the recess 12 is completely enclosed by an independent and closed housing ("package") constituted by an envelope, in that the component 14 is essentially sealed in a planar and co-planar way, particularly with the edges of the recess 12, by means of a filling material 20 (=$SiO_2$=silicon dioxide).

After sealing, three electrically conducting contacts 26, which are finished to obtain a higher electric conductivity, are lithographically provided on the sealed surface 28 of the carrier substrate 10 so as to realize contact of the obtained electric or electronic component 100 on a printed circuit board. In practice, the electric or electronic component 100 is then reflow-soldered onto the printed circuit board. It is particularly advantageous for the electric or electronic component 100 that no further envelope is required for mounting it, for example, on a printed circuit board, but rather the electric or electronic component 100 can be directly mounted on a printed circuit board without any further adapters or carriers.

In this connection, it proves to be particularly preferable that, due to bypassing the electric connections of the contact faces 16 of the component 14 via the connection elements 24 and via the contact tracks 22 provided in the recess 12, all of these electric contacts exclusively extend to the surface 28 of the carrier substrate 10 on which also the soldering face with its connection to a metallization is present on the rear side, i.e. on the surface of the component 14 remote from the bottom and/or wall area 18 of the recess 12. In other words, this means that the electric connections extend both from the front side of the component 14 and from the rear side of the component 14 to a single connection face 28 of the package.

To realize the above-mentioned "rear-side metallization", an electrically conducting contact face 30 in the form of a metallization is provided before inserting the component 14 on the surface of the component 14 remote from the bottom and/or wall area 18 of the recess 12. In connection with the three electrically conducting contacts 26 lithographically provided on the sealed surface 28 of the carrier substrate 10, an electric or electronic component 100 is thus obtained in the manner according to the invention, which component is distinguished by electrically conducting contact faces on both its "front side", i.e. on the surface of the component 14 facing the bottom and/or wall area 18 of the recess 12, and on its "rear side", i.e. on the surface of the component 14 remote from the bottom and/or wall area 18 of the recess 12. In other words, the present invention provides the possibility of processing semiconductor crystals with front side contacts as well as rear side contacts, so that the spectrum of using the electric or electronic component 100 in accordance with FIG. 1 is considerably widened.

To additionally protect the component 14 which quite often reacts sensitively to external influences, a protective coating 32 is partially provided as an additional measure on the surface of the component 14 facing the bottom and/or wall area 18 of the recess 12.

After testing the electric or electronic component 100, the surface 34 of the carrier substrate 10 opposite the surface 28 of the carrier substrate 10 may finally be printed with component-specific data (characteristic data, serial number, . . . ) by means of a laser.

In summary, components 14 having front side contacts as well as rear side contacts can thus be used in the present invention, such as, for example active and/or passive electronic, optoelectronic, micromechanical and/or components of solid materials with semiconductor and/or microsystem functions, in which dopings of the envelope in the form of the carrier substrate 10 can be dispensed with. Mounting of the component 14 on lead frames as well as the associated forming, plating, trimming, enveloping and wire-bond processes may also be dispensed with due to the insertion and sealing of the component 14 in the "bed" of the carrier material 10 and due to leading out the electric connections. Essential assembly steps are thereby eliminated so that the manufacture of the electric or electronic components 100 will be simpler and less costly.

FIG. 2 relates to a method of manufacturing a multitude of electric or electronic components 100 shown by way of example in FIG. 1. The particular feature is that a multitude of recesses 12 ("pockets") in a wafer 36 of a carrier substrate 10 of semiconducting material (silicon) is obtained by means of etching. This is followed for each recess 12 by the steps of the method already described with reference to FIG. 1, in which the multitude of the obtained electric or electronic components 100 is finally split into separate pieces by sawing the wafer 36 along the broken line shown in FIG. 2.

This manufacturing method is particularly distinguished by the fact that, on the one hand, it is based on already existing wafer technology so that the costs, risks and periods of development are smaller than for a completely new technological development. On the other hand, the material of the component 14 and the material of the wafer 36 have similar and even identical thermal properties when the same material is used, which is a significant advantage for the function, lifetime and reliability of the electric or electronic components 100 because no different temperature variations can occur and, consequently, a higher thermal load can be obtained.

List of reference signs

| | |
|---|---|
| 100 | electric or electronic component |
| 10 | carrier substrate of semiconducting or insulating material |
| 12 | recess, particularly cavity or indentation |
| 14 | component |
| 16 | electrically conducting contact face on the surface of the component 14 facing the bottom and/or wall area 18 of the recess 12 |
| 18 | bottom and/or wall area |
| 20 | filling material |
| 22 | electrically conducting contact track |
| 24 | electrically conducting connection element |
| 26 | electrically conducting contact |
| 28 | surface of the carrier substrate 10 |
| 30 | electrically conducting contact face on the surface of the component 14 remote from the bottom and/or wall area 18 of the recess 12 |
| 32 | protective coating |
| 34 | opposite surface of the carrier substrate 10 |
| 36 | wafer |

What is claimed is:

1. An electric or electronic component (100) comprising a carrier substrate (10) of a semiconducting or insulating material, at least a recess (12), particularly a cavity or indentation provided in the carrier substrate (10), at least a component (14) which is inserted into the recess (12) and whose surface having at least an electrically conducting contact face (16) faces the bottom and/or wall area (18) of the recess (12) and is contacted in the bottom and/or wall area (18) of the recess (12), and at least a filling material (20) by means of which the component (14) inserted into the recess (12) is sealed particularly with the edges of the recess (12), characterized in that at least an electrically conducting contact track (22) extending from the bottom and/or wall area (18) of the recess (12) to the surface (28) of the carrier substrate (10) is provided, and in that at least an electrically conducting connection element (24) is arranged between the respective contact face (16) of the component (14) and the respective section of the contact track (22) present in the bottom and/or wall area (18) of the recess (12), by which connection element the contact face (16) of the component (14) is connected to the section of the contact track (22) present in the bottom and/or wall area (18) of the recess (12).

2. A component as claimed in claim 1, characterized in that the recess (12) is essentially formed as a groove, trough or tub.

3. A component as claimed in claim 1, characterized in that the connection element (24) is made of an electrically conducting material, particularly lead.

4. A component as claimed in claim 1, characterized in that the connection element (24) is essentially hill-shaped, essentially pillow-shaped or essentially ball-shaped.

5. A component as claimed in claim 1, characterized in that the component (14) is at least an IC chip and/or at least an electrically active or electronically active (semiconductor) crystal.

6. A component as claimed in claim 1, characterized in that the filling material (20) for sealing the component (14) inserted into the recess (12) is silicon dioxide ($SiO_2$).

7. A component as claimed in claim 1, characterized in that at least an electrically conducting contact (26) is provided, particularly lithographically, on the sealed surface (28) of the carrier substrate (10).

8. A component as claimed in claim 7, characterized in that the contact (26) is machine-finished.

9. A component as claimed in claim 1, characterized in that the surface of the component (14) remote from the bottom and/or wall area (18) of the recess (12) at least partially has at least an electrically conducting contact face (30).

10. A component as claimed in claim 9, characterized in that the surface of the component (14) remote from the bottom and/or wall area (18) of the recess (12) has at least partially arranged contact faces (30) in the form of at least a metallization.

11. A component as claimed in claim 1, characterized in that the component (14) is at least partially provided with at least a protective coating (32).

12. A component as claimed in claim 11, characterized in that the protective coating (32) is at least partially provided on the surface of the component (14) facing the bottom and/or wall area (18) of the recess (12).

13. A printed circuit board comprising at least an electric or electronic component (100) as claimed in claim 1.

14. A method of manufacturing an electric or electronic component (100), the method comprising the steps of:
generating, particularly etching, at least a recess (12) particularly at least a cavity or indentation, in a carrier substrate (10) of a semiconducting or insulating material,
inserting at least a component (14), particularly at least an IC chip and/or at least an electrically active or electronically active (semiconductor) crystal, into the recess (12), in which the surface of the component (14) having at least an electrically conducting contact face (16) faces the bottom and/or wall area (18) of the recess (12) and is contacted in the bottom and/or wall area (18) of the recess (12), and sealing the component (14) inserted into the recess (12), particularly with the edges of the recess (12), by means of at least a filling material (20), characterized in that, prior to inserting the component (14), at least an electrically conducting contact track (22) extending from the bottom and/or wall area (18) of the recess (12) to the surface (28) of the carrier substrate (10) is provided, particularly lithographically, and in that at least one, particularly two or more electrically conducting connection elements (24) are arranged, by which the at least one, particularly two or more contact faces (16) of the component (14) are connected to the respective section, present in the bottom and/or wall area (18) of the recess (12), of the at least one, particularly two or more contact tracks (22).

15. A method as claimed in claim 14, characterized in that, prior to inserting the component (14), the connection element (24) is arranged in a fluid and/or moldable state so as to adapt the position of the component (14) in the recess (12) to the bottom and/or wall area (18) of the recess (12) and/or to the contact face (16) of the component (14) by way of deformation of the connection element (24).

16. A method as claimed in claim 14, characterized in that, prior to inserting the component (14), the connection element (24) is provided on the section of the contact track (22) present in the bottom and/or wall area (18) of the recess (12).

17. A method as claimed in claim 14, characterized in that, prior to inserting the component (14), the connection element (24) is provided on the contact face (16) of the component (14).

18. A method as claimed in claim 14, characterized in that, prior to inserting the component (14), the connection element (24) is partly provided on the section of the contact track (22) present in the bottom and/or wall area (18) of the recess (12) and partly on the contact face (16) of the component (14).

19. A method as claimed in claim 14, characterized in that, prior to inserting the component (14), the connection element (24) is provided by depositing electrically conducting material particularly from a liquid phase (for example, galvanic growth) or particularly from a gaseous phase.

20. A method as claimed in claim 14, characterized in that, prior to inserting the component (14), the connection element (24) is provided in the form of at least a drop of electrically conducting material, particularly by sealing with at least a metal wire.

21. A method as claimed in claim 14 characterized in that the section of the contact track (22) present in the bottom and/or wall area (18) of the recess (12) and the contact face (16) of the component (14) are soldered together by means of the connection element (24).

22. A method as claimed in claim 14 characterized in that the contact track (22) is machine-finished.

23. A method as claimed in claim 14, characterized in that, after sealing, at least one electrically conducting contact (26) is provided, particularly lithographically, on the sealed surface (28) of the carrier substrate (10).

24. A method as claimed in claim 23, characterized in that the contact (26) is machine-finished.

25. A method as claimed in claim 14, characterized in that, prior to inserting the component (14), at least one electrically conducting contact face (30), particularly in the form of at least a metallization, is at least partially provided on the surface of the component (14) remote from the bottom and/or wall area (18) of the recess (12).

26. A method as claimed in claim 14, characterized in that, prior to inserting the component (14), at least a protective coating (32) is at least partially provided on the component (14).

27. A method as claimed in claim 26, characterized in that the protective coating (32) is provided at least partially on the surface of the component (14) facing the bottom and/or wall area (18) of the recess (12).

28. A method as claimed in claim 14, characterized in that, after sealing and possibly testing the component (14), the surface (34) of the carrier substrate (10) opposite the surface (28) of the carrier substrate (10) is printed, particularly by means of a laser.

29. A method of manufacturing a multitude of electric or electronic components (100), particularly as claimed in claim 14, characterized by the steps of:

generating, particularly etching, a multitude of recesses (12), particularly cavities or indentations, in a wafer (36) of a carrier substrate (10) of a semiconducting or insulating material, providing, particularly lithographically providing, at least one electrically conducting contact track (22) extending from the bottom and/or wall area (18) of a recess (12) to the surface (28) of the carrier substrate (10) associated with the relevant recess (12), arranging at least one, particularly two or more electrically conducting connection elements (24) for connecting at least one, particularly two or more electrically conducting contact faces (16) present on the surface of a component (14), particularly of an IC chip and/or an electrically active or electronically active (semiconductor) crystal on the respective section, present in the bottom and/or wall area (18) of the recess (12), of the at least one, particularly two or more contact tracks (22), inserting at least one of the components (14) into each recess (12), in which the surface of the respective component (14) having the contact face (16) faces the bottom and/or wall area (18) of the respective recess (12) and is contacted in the bottom and/or wall area (18) of the recess (12), sealing the components (14), inserted into the recesses (12), particularly with the edges of the recesses (12) by means of at least a filling material (20), and splitting the multitude of components (100) into individual pieces, particularly by mechanical and/or optical sawing of the wafer (36).

* * * * *